(12) United States Patent
Rietzler et al.

(10) Patent No.: US 8,415,782 B2
(45) Date of Patent: Apr. 9, 2013

(54) CHIP CARD HAVING A PLURALITY OF COMPONENTS

(75) Inventors: Manfred Rietzler, Marktoberdorf (DE); Raymond Freeman, Mesa, AZ (US)

(73) Assignee: Smartrac IP B.V., Amsterdam (NL)

( * ) Notice: Subject to any disclaimer, the term of this patent is extended or adjusted under 35 U.S.C. 154(b) by 0 days.

(21) Appl. No.: 12/994,078

(22) PCT Filed: May 14, 2009

(86) PCT No.: PCT/EP2009/003417
§ 371 (c)(1),
(2), (4) Date: Nov. 22, 2010

(87) PCT Pub. No.: WO2009/141088
PCT Pub. Date: Nov. 26, 2009

(65) Prior Publication Data
US 2011/0074001 A1    Mar. 31, 2011

(30) Foreign Application Priority Data
May 23, 2008  (DE) .......................... 10 2008 024 823

(51) Int. Cl.
*H01L 23/02*  (2006.01)
(52) U.S. Cl.
USPC .......................................... 257/679; 438/107
(58) Field of Classification Search ................. 257/679, 257/E23.18, E21.499; 438/107
See application file for complete search history.

(56) References Cited

U.S. PATENT DOCUMENTS
7,905,420 B2 * 3/2011 Schroder ...................... 235/492

FOREIGN PATENT DOCUMENTS

| DE | 195 00 925 C2 | 1/1995 |
|---|---|---|
| DE | 196 11 237 A1 | 9/1997 |
| DE | 19611237 A1 * | 9/1997 |
| DE | 199 42 932 A1 | 9/1999 |
| DE | 101 07 072 A1 | 2/2001 |
| DE | 10 2004 042145 A1 | 3/2006 |
| EP | 1 411 466 A | 4/2004 |
| JP | 08276688 A1 | 10/1996 |
| JP | 2001024107 A1 | 1/2001 |

OTHER PUBLICATIONS

PCT International Preliminary Report on Patentability, Application No. PCT/EP2009/003417, Dec. 16, 2010.
International Search Report under date of Aug. 21, 2009 in connection with PCT/EP2009/003417.
Finkenzeller, Klaus: "RFID-Handbuch: Grundlagen und praktische Answendungen induktiver Funkanlagen, Transponder und kongtaktloser Chipkarten" 1998, Hanser, Munchen; XP002541372; ISBN: 3-446-19376-6; Kapitel 12.4 (Seiten 210-214).
Japanese Language and English Translation of a Notice of Reasons for Refusal, Japanese Patent Application No. 2011-509882, Nov. 29, 2012.

* cited by examiner

*Primary Examiner* — Phuc Dang
(74) *Attorney, Agent, or Firm* — Quarles & Brady LLP

(57) ABSTRACT

The present invention relates to a chip card and a method for the production of a chip card having a chip (21) which is arranged in a card body, and having a plurality of components (18, 19, 22) being electrically conductively connected to the chip by means of a conductor arrangement (20), wherein the card body is composed of a plurality of substrate layers (11, 12, 13) which are arranged in a layer structure, wherein the components and the conductor arrangement are arranged in different substrate layers, specifically a component layer arrangement and a connecting layer arrangement, and have contact surfaces (23, 24, 25, 26, 31, 32, 33, 34), which are disposed so as to overlap one another, for producing an electrically conductive contacting.

14 Claims, 4 Drawing Sheets

CHIP CARD HAVING A PLURALITY OF COMPONENTS

CROSS-REFERENCE TO RELATED APPLICATIONS

This application claims priority to PCT International Application No. PCT/EP2009/003417 filed on May 14, 2009, which claims priority to German Patent Application No. 10 2008 024 823.1 filed May 23, 2008, both of which are incorporated herein by reference.

The present invention relates to a chip card having a chip, which is arranged in a card body, and having a plurality of components being electrically conductively connected to the chip by means of a connecting conductor arrangement, wherein the card body is composed of a plurality of substrate layers which are arranged in a layer structure. Moreover, the invention relates to a method for the production of a chip card.

Chip cards of the above-cited type are known to come in different embodiments, which differ in particular in the type and number of the components included in the chip card. It is for instance known to design such chip cards in the form of so-called "active" cards, which have an energy supply unit, such as a battery, which is integrated in the card body and which is electrically conductively connected to the chip via a connecting conductor arrangement and which supplies the chip and for instance a display device, which may be provided in the card body in addition to the chip, with the necessary operating voltage.

Moreover, "passive" chip cards are also known, wherein the chip is disposed in a transponder arrangement having an antenna device, which serves for supplying the chip with energy derived from an energy source provided on the outside of the card body and which serves for data transfer. In this context, the chip may be directly contacted with the antenna device or may be connected to the antenna device with the aid of a connecting conductor arrangement, wherein the connecting conductor arrangement, where appropriate, serves for connecting the chip to further components, such as a display device.

Apart from the components exemplarily cited above, which are arranged in the same card body as the chip and which are connected to the chip via a connecting conductor arrangement, depending on the efficiency profile required for the chip card, a plurality of other components are known, such as a loudspeaker or a switch, which can be contacted with the chip via the connecting conductor arrangement.

Depending on the number of the components which are arranged in a card body, it is thus possible that an overall complex connecting conductor structure is obtained in the card body, which on the one hand makes it more difficult to produce a reliable chip card and which, in particular in the case of a card body composed of a plurality of substrate layers which are arranged in a layer structure, requires a frequently changing design of the individual substrate layers.

In practice, the complexity of the connecting conductor structure in the card body and the variations in the layer design resulting from the different efficiency profiles of the chip cards lead to corresponding production expenditure and the costs associated therewith.

Thus, it is an object of the present invention to suggest a configuration and a production method for a chip card which simplify the production of chip cards with different efficiency profiles.

To attain this object, the inventive chip card encompasses the features of claim 1.

In the inventive chip card, the components and the connecting conductor arrangement are disposed in different substrate layers, specifically a component layer arrangement and a connecting layer arrangement, and have contact surfaces which are disposed so as to overlap one another for producing an electrically conductive contacting.

The inventive chip card configuration thus enables a modular structure which is defined in correspondence with the desired efficiency profile of the chip card and which is composed of standardized substrate layers which are combined according to the desired efficiency profile of the chip card.

If the connecting layer arrangement features a plurality of connecting layers which are each provided with a connecting conductor module, in such a manner that the connecting conductor modules being contacted with one another via contact surfaces form the connecting conductor arrangement, it is possible to configure already the connecting conductor arrangement in accordance with the desired efficiency profile of the chip card in a modular manner so as to be composed of individual connecting layers.

According to a preferred embodiment of the chip card, the connecting layer arrangement is provided with a component layer arrangement composed of one or several component layers and being provided with an output device or an input device as well as an energy supply device for the chip.

If the output device or the input device is arranged in a first component layer and the energy supply device is arranged in a second component layer, it is possible to use the assigned component layer in its entirety for arranging, respectively forming, the energy supply unit, so that for instance battery devices can be realized which extend over the entire surface of the substrate layer and which may thus feature a corresponding capacity.

It is especially advantageous if the connecting layer arrangement is arranged between the component layers, so that a direct contacting can be performed between the contact surfaces of the components being arranged in the component layers and the contact surfaces of the connecting conductor arrangement.

In particular in case of a large number of components having a corresponding number of component layers, it is advantageous if the connecting layers of the connecting layer arrangement and the component layers of the component layer arrangement are alternately disposed on top of one another.

Depending on the type of the components which are combined in a chip card, it may also be advantageous if the components are at least partially arranged in component groups in a common group component layer, namely for instance a display device and a press switch activating the display device.

In other cases, for instance where a battery device is used as a component, it may also prove to be advantageous if the components are at least partially arranged as individual components in individual component layers.

If the components extend at least partially over several adjacent component layers, it is possible to accommodate larger components, such as a chip module, also in a layer structure being formed of individual substrate layers, in such a manner that the chip carrier of the chip module, which is provided with a terminal contacting, is accommodated in a component layer, and the chip, which is provided with a casting, is accommodated in a further component layer.

Preferably, the components are arranged in component recesses which are formed of at least one window opening being arranged in one or more component layers, so that the component recesses can be readily adapted in their size.

If the window openings are provided with a filler material, cavities in the card body can be prevented.

Preferably, the filler material is formed of a thermally activatable adhesive material, so that also in the case of comparatively low lamination temperatures, a reliable layer structure can be obtained also in the region of the window openings.

If a thermally activatable adhesive layer is provided between the substrate layers forming the connecting layer and the component layers, the production of the card body can be completely performed in the lamination process at comparatively low lamination temperatures by way of a so-called "hot lamination".

To attain this object, the inventive method encompasses the features of claim 14.

According to the invention, in a first method step, the card body is produced in the form of a laminate configuration composed of a plurality of component layers and connecting layers being connected to one another in a laminate structure. Only following this method step, in a further lamination step, cover layers are applied to the card body. In this manner, starting from a card body being configured as a neutral functional unit, by means of the subsequent application of for instance cover layers which are provided with an imprint, individualized chip cards can be produced.

Hereinafter, preferred embodiments of the chip card will be described in more detail with reference to the drawings:

Figure 1:
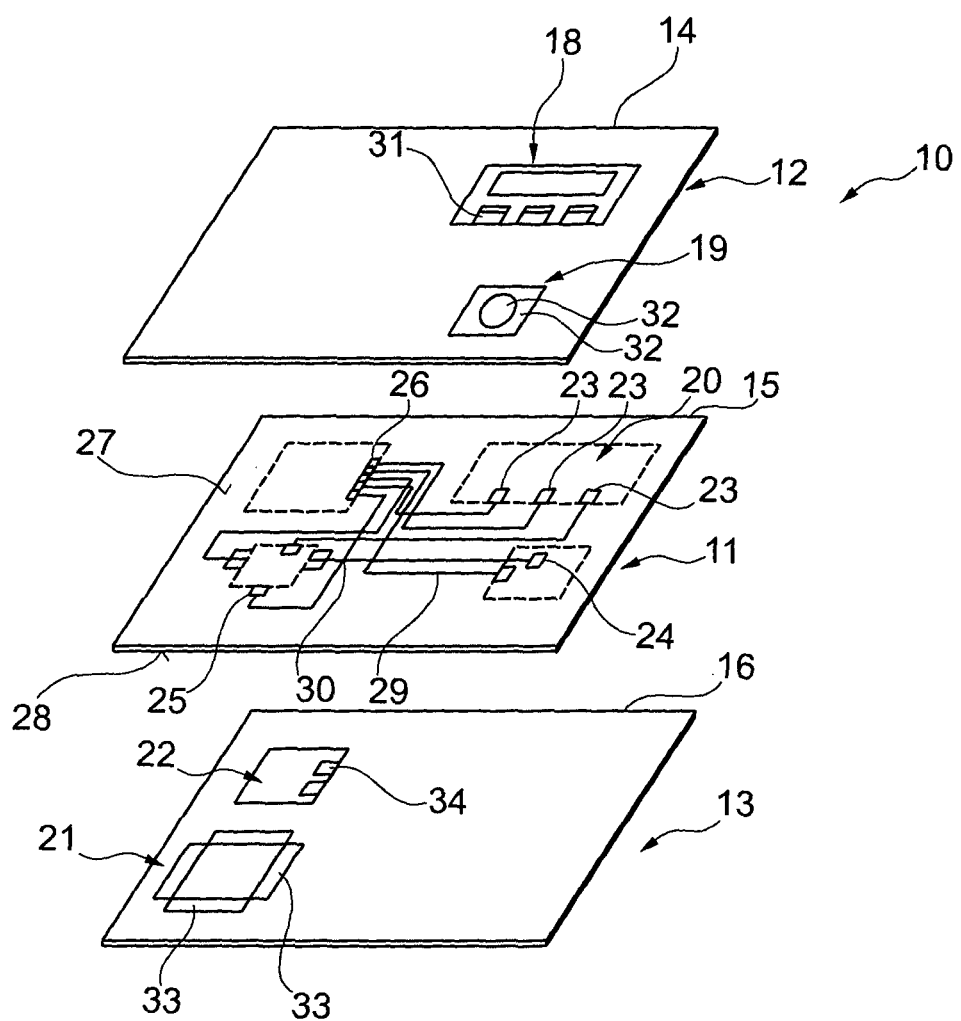
FIG. 1 shows a layer structure for a chip card according to a first embodiment.

FIG. 1 shows a layer structure for a chip card 10 having a connecting conductor layer 11, which is arranged as an intermediate layer between an upper component layer 12 and a lower component layer 13. The connecting conductor layer 11 and the component layers 12, 13 in the case of the present exemplary embodiment feature substrates 14, 15 and 16 made of PVC or PC, which for the production of the chip card 10 are planarly connected with one another in a lamination process known per se and thus form a card body 17 created by the layer structure, as shown in FIG. 1A.

In the exemplary embodiment illustrated in FIG. 1, the upper component layer 12 features a display device 18, which is here formed as a "segment display", and a press button 19, both of which are contacted with a chip 21 and a battery device 22 via a connecting conductor arrangement 20 being formed in the connecting conductor layer 11, and both of which are arranged on the substrate 16 of the lower component layer 13.

The connecting conductor arrangement 20 of the connecting conductor layer 11, in the example illustrated in FIG. 1, is formed as a wire conductor arrangement having wire conductors 29 which at their free ends feature contact surfaces 23, 24, 25 and 26 being respectively assigned to the components which are here embodied as a display device 18, a press button 19, a chip 20 and a battery device 22. In the case at hand, the contact surfaces 23, 24, 25 and 26 are formed as vias which are accessible both from an upper side 27 and from a lower side 28 of the connecting conductor layer 11. The wire conductors 29, in the case of the present exemplary embodiment, are provided with an insulating envelope, so that the formation of conductor bridges 30 is enabled without the risk of short-circuits.

Figure 1A:
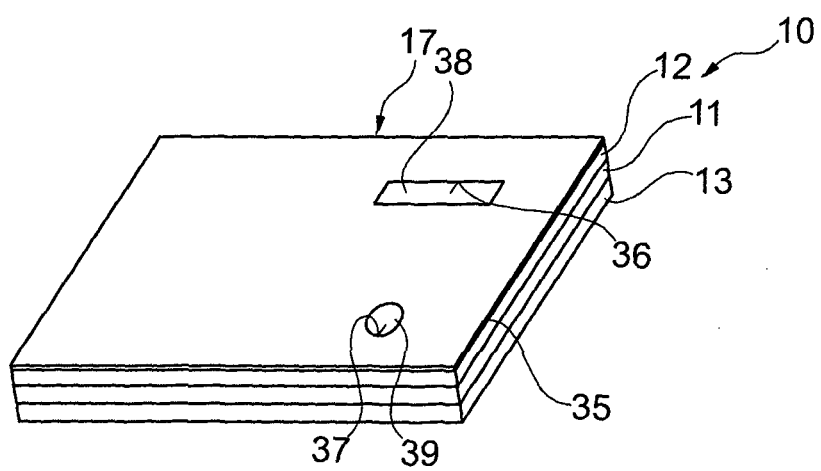
FIG. 1A shows the chip card produced from the layer structure.

As shown in FIG. 1, the components, which are arranged in the component layers 12 and 13 and which are here embodied as a display device 18, a press button 19, a chip 21 and a battery device 22, are provided with contact surfaces 31, 32, 33 and 34, which are arranged on the component layers 12, 13 in such a manner that they are disposed so as to overlap contact surfaces 23 to 26 of the connecting conductor arrangement 20 and thus, as a result of the production of the card body 17 illustrated in FIG. 1A and being formed as a layer structure, a direct contacting is realized between the contact surfaces 23 to 26 of the components (display device 18, press button 19, chip 21, battery device 22) and the contact surfaces 31 to 34 of the connecting conductor arrangement 20, so that the connecting conductor structure required for the operation of the chip card 10 is created.

As shown in FIG. 1A, the card body 17 may be provided with an additional cover layer 35, which has two window openings 36, 37 being arranged in such a manner that the display device 18 and the press button 19 are covered to the extent that only one display field 38 and one button 39 are accessible, respectively visible, from the outside. It is equally possible to design the cover layer so as to be transparent and without a window opening.

Figure 2:
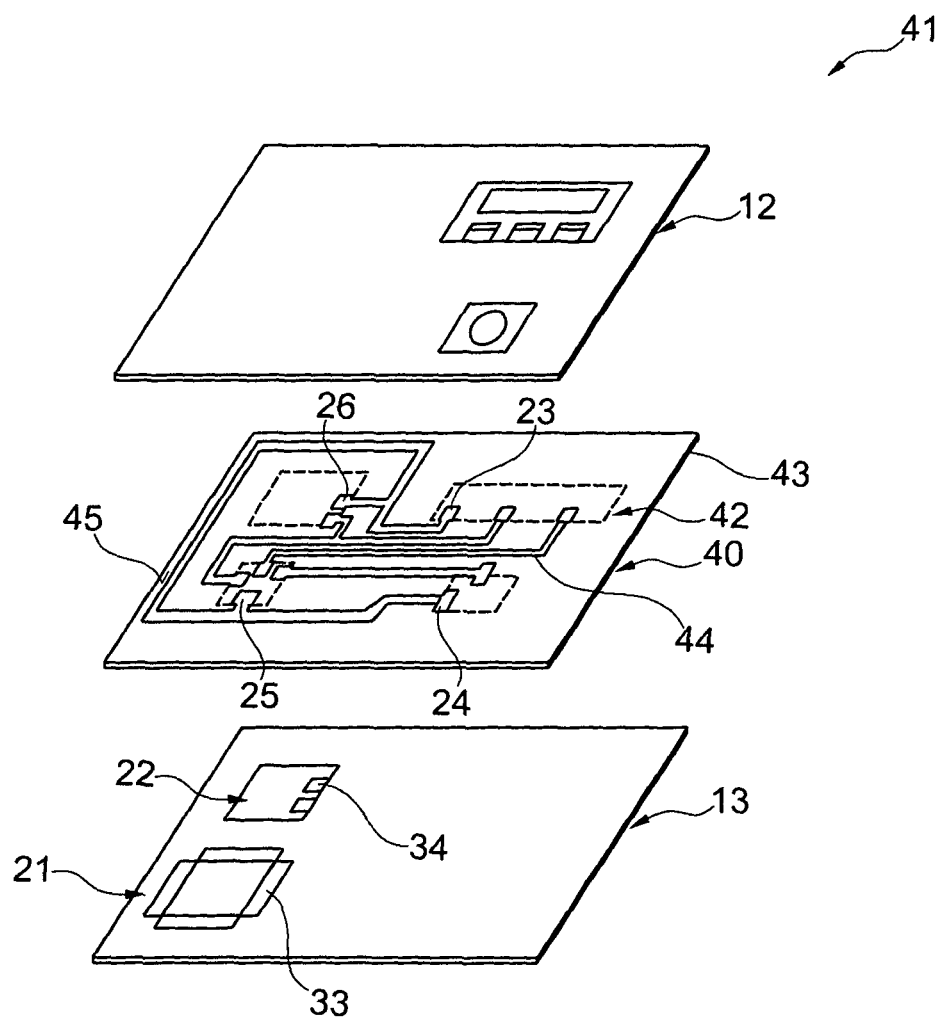
FIG. 2 shows a layer structure for a chip card according to a second embodiment.

FIG. 2 shows a configuration for a chip card 41, which is composed of two component layers 12, 13 and one connecting conductor layer 40.

Corresponding to the use of identical reference numerals, the component layers 12, 13 of the chip card 41 are identically formed with the component layers 12, 13 of the chip card 10.

In contrast to the chip card 10 illustrated in FIG. 1, a connecting conductor arrangement 42 formed on the connecting conductor layer 40 is not designed with wire conductors 29. Instead, the connecting conductor arrangement 42 features a metallization structure 44 applied to a substrate 43, which can be produced for instance in a metal deposition process or in an etching process performed on an upper side 45 of the substrate 43. In correspondence with the connecting conductor arrangement 20 of the chip card 10 illustrated in FIG. 1, the connecting conductor arrangement 42 formed with the aid of a metallization structure 44 has contact surfaces 31 to 34, which, in the manner already described with reference to FIG. 1, are assigned to the contact surfaces 23 to 26 of the components of the component layers 12, 13, which are here equally embodied as a display device 18, a press button 19, a chip 21 and a battery device 22.

Figure 3:
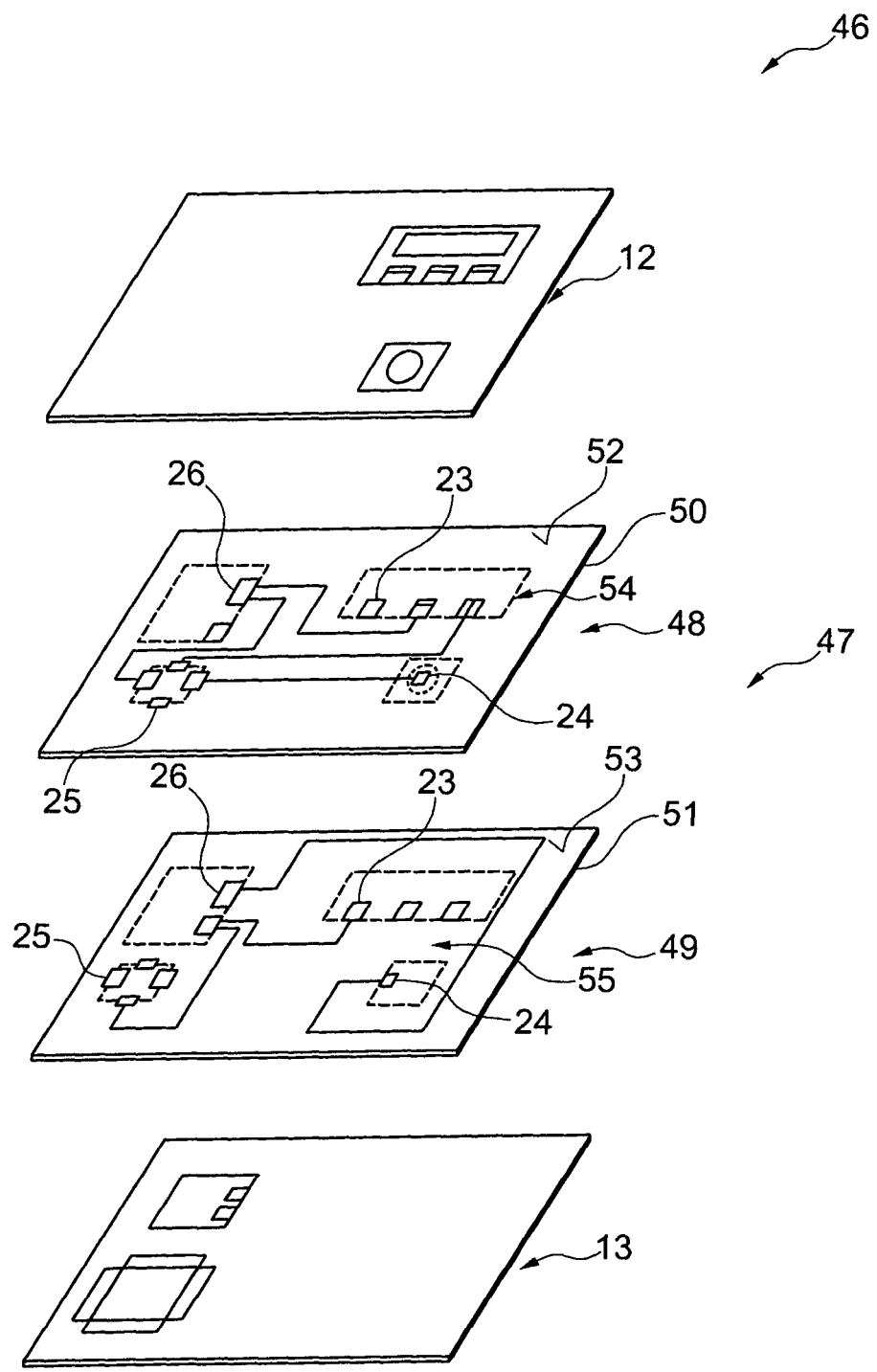
FIG. 3 shows a layer structure for a chip card according to a third embodiment.

FIG. 3 shows a configuration of a chip card 46, which, corresponding to the use of identical reference numerals, features component layers 12, 13 being identical to the component layers 12, 13 of the chip cards 10 and 41 illustrated in FIGS. 1 and 2. In contrast to the chip cards 10 and 41, the configuration of the chip card 46 includes a connecting conductor arrangement 47 which is modularly composed of two connecting conductor layers 48 and 49. The connecting conductor layers 48 and 49 feature connecting conductor modules 54, 55 having respectively congruently arranged contact surfaces 23 to 26, which are formed as vias in a substrate 50 of the connecting conductor layer 48 and in a substrate 51 of the connecting conductor layer 49. The connecting conductor modules 54 and 55, which are each formed on an upper side 52, respectively 53, of the substrates 50, respectively 51, are arranged in such a manner that a connecting conductor arrangement 47 is created, which produces the same electrical effect as the connecting conductor arrangement 20 illustrated in FIG. 1 when the contact surfaces 23 to 26 of the connecting conductor layers 48 and 49 are contacted with one another. In the light of the aspect that the substrate 50 of the connecting conductor layer 48 being arranged above the connecting conductor layer 49 in FIG. 3 acts as an electrical insulation, both connecting conductor modules 54 and 55, which are each arranged on the connecting conductor layers 48 and 49, can be formed in any arbitrary fashion, in particular also without an insulation. Thus, the connecting conductor modules 54 and 55 can be formed as insulated or else non-insulated wire conductors or equally as a metallization, such as the connecting conductor arrangement 42 of the chip card 41 illustrated in FIG. 2.

Figure 4:
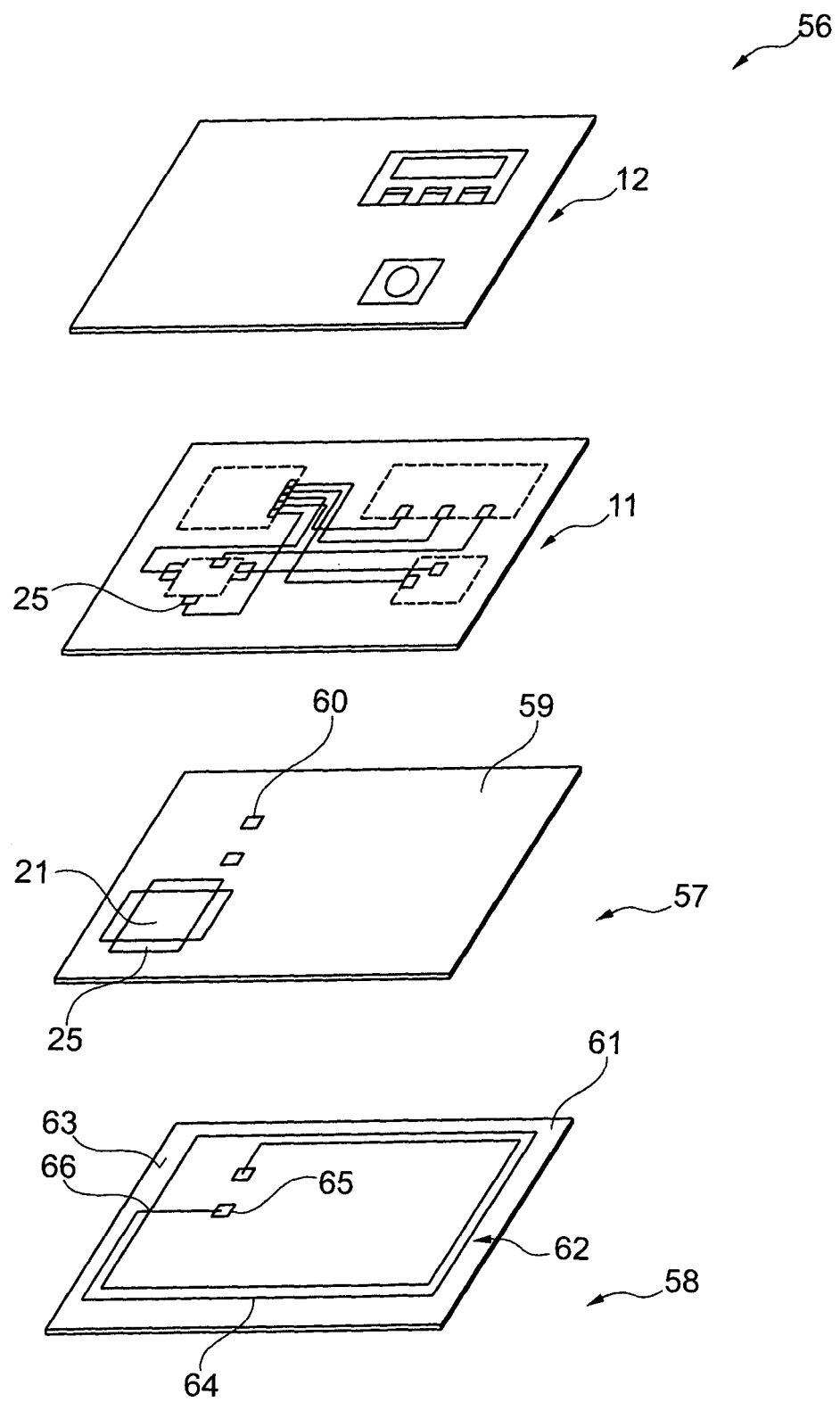
FIG. 4 shows a layer structure for a chip card according to a fourth embodiment.

FIG. 4 shows the configuration of a chip card 56 formed as a "passive card", which, in the case of the exemplary embodiment illustrated in FIG. 4 in correspondence with the chip card 10 illustrated in FIG. 1, has an upper component layer 12 with a display device 18 and a press button 19 as well as a connecting conductor layer 11 with a connecting conductor arrangement 20 formed thereon, which is provided with contact surfaces 23 to 26.

In contrast to the chip card 10 illustrated in FIG. 1, the configuration of the chip card 56 includes two further component layers 57 and 58. The component layer 57 has a chip 21 which is arranged on a substrate 59 and which has contact surfaces 25 as well as two contact surfaces 60 being formed as vias.

The component layer 58 features an antenna device 62 arranged on a substrate 61 and which, in the present case, is formed as a wire coil 64 being embedded in an upper surface 63 of the substrate 61 and having antenna contact surfaces 65 formed at the ends of the wire coil 64. Even though the antenna device is here formed as a wire coil 64, the antenna device 62 may also be formed by a metallization applied to the surface 63 of the substrate 61, which, for instance corresponding to the connecting conductor arrangement 47 illustrated in FIG. 3 and having a modular configuration, may also be modularly formed of two antenna modules being arranged on different substrates in avoidance of a conductor bridge 66.

In the light of the aspect that the contact surfaces 60 of the component layer 57 are disposed so as to overlap the antenna contact surfaces 65 of the component layer 58 and the contact surfaces 25 of the chip 21 on the component layer 57 are disposed so as to overlap the contact surfaces 25 of the connecting layer 11, a connecting conductor structure in principle corresponding to the connecting conductor structure of the chip card 10 illustrated in FIG. 1 is realized, wherein, in terms of circuitry, the battery device 22 is replaced with the antenna device 62.

The invention claimed is:

1. A chip card comprising:
a card body;
a chip arranged in the card body, said card body having a plurality of components being electrically conductively connected to the chip by a conductor arrangement, wherein the card body is composed of a plurality of substrate layers which are arranged in a layer structure, in which the components and the conductor arrangement are arranged in different substrate layers for enabling a modular structure, said different substrate layers including a component layer arrangement composed of at least one component layer and a connecting layer arrangement electrically connected to components in the component layer arrangement through contact surfaces disposed on the different substrate layers, wherein contact surfaces on one of said different substrate layers overlap contact surfaces on another of said different substrate layers to electrically connect the connecting layer arrangement to the components in the component layer arrangement.

2. The chip card according to claim 1, in which the connecting layer arrangement features a plurality of connecting layers, which are each provided with a connecting conductor module, in such a manner that the connecting conductor modules being contacted with one another via contact surfaces form the connecting conductor arrangement.

3. The chip card according to claim 1, in which the connecting layer arrangement is provided with at least one of an output device, an input device, and an energy supply device for the chip.

4. The chip card according to claim 3, in which the output device or the input device is arranged in a first component layer and the energy supply device is arranged in a second component layer.

5. The chip card according to claim 4, in which the connecting layer arrangement is arranged between the component layers.

6. The chip card according to claim 4, in which the connecting layers of the connecting layer arrangement and the component layers of the component layer arrangement are alternately disposed on top of one another.

7. The chip card according to claim 1, in which the components are at least partially arranged in component groups in a common group component layer.

8. The chip card according to claim 1, in which the components are at least partially arranged as individual components in individual component layers.

9. The chip card according to claim 1, in which the components extend at least partially over several adjacent component layers.

10. The chip card according to claim 1, in which the components are arranged in component recesses which are formed of at least one window opening being arranged in one or more component layers.

11. The chip card according to claim 10, in which the window openings are provided with a filler material.

12. The chip card according to claim 11, in which the filler material is formed of a thermally activatable adhesive material.

13. The chip card according to claim 1, in which a thermally activatable adhesive layer is provided between the substrate layers which form the connecting layers and the component layers.

14. A method for producing a chip card according to claim 1, in which subsequent to the production of the card body in the form of a laminate structure having a plurality of component layers and connecting layers, which are connected to one another in a laminate structure, cover layers are applied to the card body in a lamination step.

* * * * *

UNITED STATES PATENT AND TRADEMARK OFFICE
CERTIFICATE OF CORRECTION

PATENT NO.       : 8,415,782 B2
APPLICATION NO. : 12/994078
DATED            : April 9, 2013
INVENTOR(S)      : Rietzler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 157 days.

Signed and Sealed this
First Day of September, 2015

Michelle K. Lee
*Director of the United States Patent and Trademark Office*